(12) United States Patent
Jang

(10) Patent No.: US 7,804,722 B2
(45) Date of Patent: Sep. 28, 2010

(54) VOLTAGE SUPPLY CIRCUIT AND FLASH MEMORY DEVICE INCLUDING THE SAME, AND METHOD OF SUPPLYING OPERATING VOLTAGE

(75) Inventor: Chae-Kyu Jang, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 161 days.

(21) Appl. No.: 11/951,164

(22) Filed: Dec. 5, 2007

(65) Prior Publication Data
US 2009/0027957 A1    Jan. 29, 2009

(30) Foreign Application Priority Data
Jul. 25, 2007   (KR) ............... 10-2007-0074544
Oct. 19, 2007   (KR) ............... 10-2007-0105624

(51) Int. Cl.
*G11C 5/14*    (2006.01)
(52) U.S. Cl. .................. 365/189.09; 365/185.18; 365/230.06; 365/235; 365/189.04
(58) Field of Classification Search ........... 365/185.18, 365/189.09, 230.06, 235, 189.04
See application file for complete search history.

(56) References Cited

U.S. PATENT DOCUMENTS

| 2005/0018483 A1* | 1/2005 | Imamiya et al. ......... 365/185.09 |
| 2005/0057997 A1* | 3/2005 | Mitani et al. ................ 365/222 |
| 2007/0074194 A1* | 3/2007 | Hahn et al. .................. 717/150 |

FOREIGN PATENT DOCUMENTS

| KR | 10-20060043897 A | 5/2006 |
| KR |    100612569 B1  | 8/2006 |
| KR |   10-0648295 B1  | 11/2006 |

* cited by examiner

*Primary Examiner*—Thong Q Le
(74) *Attorney, Agent, or Firm*—Townsend and Townsend and Crew LLP

(57) ABSTRACT

A voltage supply circuit includes a voltage generator and a controller. The voltage generator is configured to pump an externally input voltage and store the pumped external voltage as a first voltage having a set voltage level, before power-up begins, or pump the external voltage, add the pumped voltage to the stored voltage, and output the added voltage as an operating voltage. The controller is configured to output a first control signal to drive the voltage generator or stop operation of the voltage generator, according to an operating state.

24 Claims, 4 Drawing Sheets

VOLTAGE SUPPLY CIRCUIT AND FLASH MEMORY DEVICE INCLUDING THE SAME, AND METHOD OF SUPPLYING OPERATING VOLTAGE

CROSS-REFERENCES TO RELATED APPLICATIONS

The present application claims priority to Korean patent application number 10-2007-74544, filed on Jul. 25, 2007, Korean patent application number 10-2007-105624, filed on Oct. 19, 2007, which is incorporated by reference in its entirety.

BACKGROUND OF THE INVENTION

The present invention relates to a voltage supply circuit of a flash memory device and, more particularly, to a voltage supply circuit for performing a pumping operation simultaneously with the application of a power source and a flash memory device including the same, and a method of supplying an operating voltage.

In semiconductor memory devices, in particular, flash memory devices that enable electrical erasure and programming, Fowler-Nordheim (F-N) tunneling and hot electron injection methods are employed to perform an erase operation for erasing data stored in a memory cell and a program operation for storing data in the memory cell.

In order to program data into a memory cell, the hot electron injection method is used. In a hot electron injection method, electrons of a channel region adjacent to the drain region of the memory cell are injected into a floating gate of the memory cell. A high voltage for programming is applied to the control gate of the memory cell. A high voltage for the operation of a flash memory device generally ranges from 15 V to 20 V. In general, a flash memory device operating at a low power supply voltage includes a voltage supply circuit for generating a high voltage within a chip that includes the flash memory device. The voltage supply circuit is generally configured to pump an input low voltage to a high voltage by employing a voltage pumping circuit.

FIG. 1A is a flowchart illustrating the operation of a conventional voltage supply circuit for supplying a program voltage.

Referring to FIG. 1A, the voltage supply circuit for supplying a voltage for programming a flash memory device cannot supply a voltage sufficient to drive the flash memory device even though an external voltage is supplied to the flash memory device. Thus, any operation should not be performed up to a certain Power-Up Point (PUP). To this end, the external voltage should not be used as an internal voltage of the flash memory device up to the PUP.

If the PUP is reached in step 101, an external voltage is input to the flash memory device and the flash memory device performs initialization for an operation. Since a voltage supply circuit does not start a pumping operation, an output voltage Va has the same level as an external voltage VDD in step S103.

If a command for a program operation is input to the flash memory device and an active command is thus input to the voltage supply circuit in step S105, the voltage supply circuit starts a pumping operation to raise the output voltage Va in step S107. If the output voltage Va is raised by such pumping and the output voltage reaches a desired target voltage in step S109, the pumping operation is finished.

The voltage supply circuit employs the operating current of the flash memory device to obtain a desired output voltage Va. Thus, the pumping operation is performed using most of the operating current of the flash memory device. As the external voltage VDD is applied to the flash memory device, a point where power-up begins is as follows.

FIG. 1B is a view illustrating an operational relationship between an external voltage and the conventional voltage supply circuit.

Referring to FIG. 1B, if the external voltage reaches a certain level (for example, a PUP), the flash memory device is initialized. At this time, in a region A, the voltage supply circuit does not perform any pumping operation. If an active command is input, the voltage supply circuit performs a pumping operation from the external voltage (VDD) level to a desired target voltage using an internal operating current, thereby providing the output voltage Va.

In other words, the voltage supply circuit does not perform an operation for voltage pumping until an idle state or the PUP is reached, but starts the voltage pumping operation after the active command is input. Consequently, most of the operating current of the flash memory device is consumed.

BRIEF SUMMARY OF THE INVENTION

The present invention is directed towards a voltage supply circuit and a flash memory device including the same, and a method of supplying an operating voltage, in which the voltage supply circuit for supplying an operating voltage to the flash memory device stores a certain level of voltage by performing a voltage pumping operation before it reaches a PUP or when it is in an idle state, thereby reducing the time required for voltage pumping in an active state and saving consumption current.

In one embodiment, a voltage supply circuit includes a voltage generator and a controller. The voltage generator is configured to pump an externally input voltage and store the pumped external voltage as a first voltage having a set voltage level, before power-up begins, or pump the external voltage, add the pumped voltage to the stored voltage, and output the added voltage as an operating voltage. The controller is configured to output a first control signal to drive the voltage generator or stop an operation of the voltage generator, according to an operating state.

In another embodiment, a flash memory device includes a memory cell array including a plurality of memory cells respectively connected to a plurality of bit line pairs and a plurality of word lines; a plurality of page buffer circuits corresponding to the plurality of bit line pairs, respectively, and configured to program data into the memory cells or read data stored in the memory cells; a voltage supply unit configured to raise an external voltage, generate the raised voltage as an initial voltage, and store the generated voltage, or raise the initial voltage and generate an operating voltage for a program or read operation; and Y decoder circuits connected to the plurality of page buffer circuits, respectively, and a data I/O line, and configured to transmit program data to the page buffer circuits and output read data, which is received from the page buffer circuits, to the data I/O line.

In still another embodiment, a method of supplying an operating voltage of a flash memory device includes raising a voltage level using an external voltage before power-up and generating a first voltage, determining a current operating state, if, as a result of the determination, the current operating state is an idle state, pumping the external voltage, adding the pumped voltage to the first voltage, and generating the added voltage as a second voltage, and if the current operating state shifts to an active state, pumping the external voltage, adding the pumped voltage to the second voltage, and generating an operating voltage for program or read.

DESCRIPTION OF SPECIFIC EMBODIMENTS

Specific embodiments according to the present invention will be described with reference to the accompanying drawings.

Figure 1A:
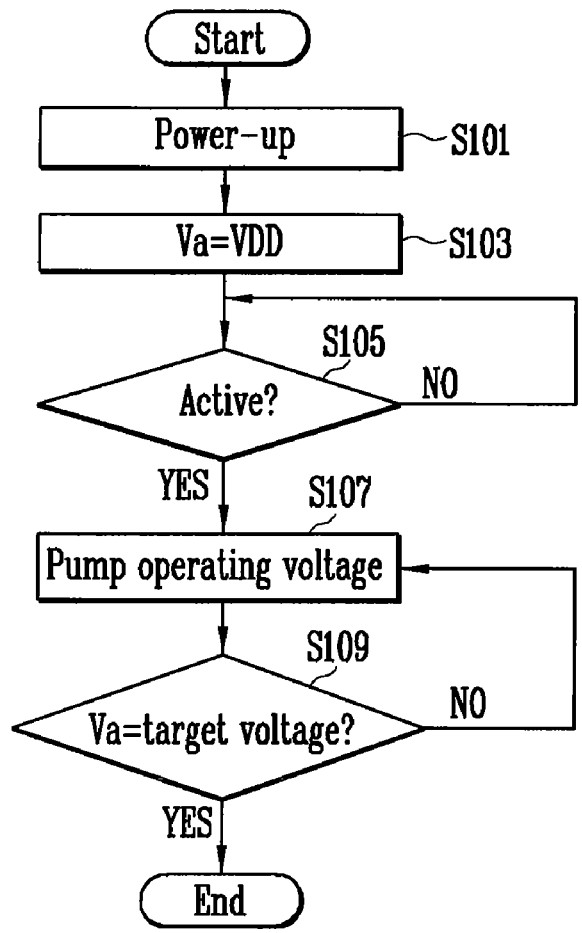
FIG. 1A is a flowchart illustrating the operation of a conventional voltage supply circuit for supplying a program voltage.
Figure 1B:
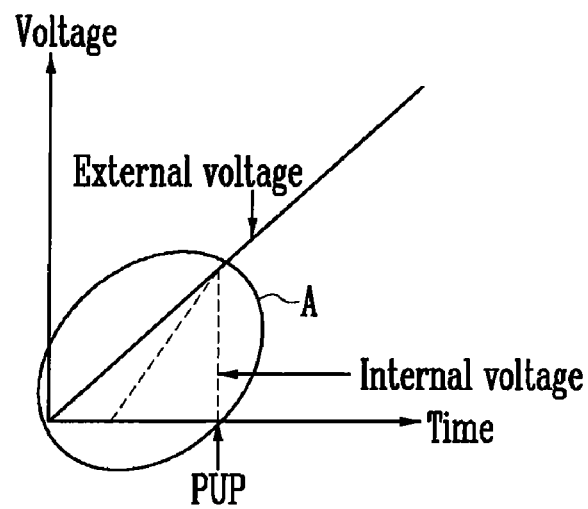
FIG. 1B is a view illustrating an operational relationship between an external voltage and the conventional voltage supply circuit.
Figure 2A:
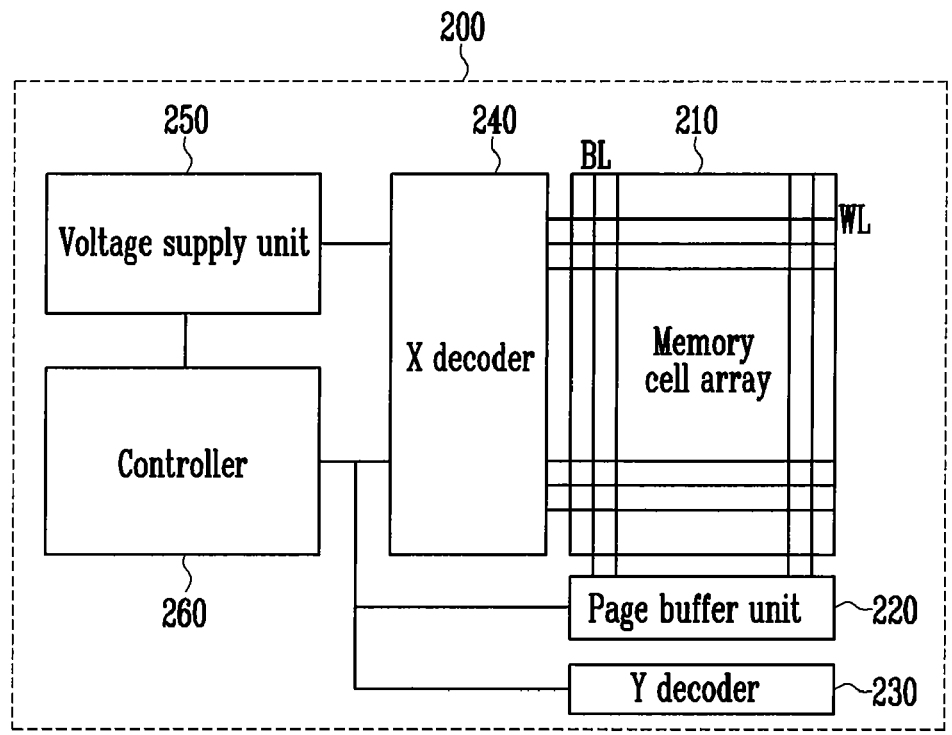
FIG. 2A is a block diagram of a flash memory device according to an embodiment of the present invention.

FIG. 2A is a block diagram of a flash memory device according to an embodiment of the present invention.

Referring to FIG. 2A, a flash memory device 200 according to an embodiment of the present invention includes a memory cell array 210 including a plurality of memory cells for data storage, which are comprised of word lines and bit lines, a page buffer unit 220 for programming data into the memory cell array 210 or reading data stored in the memory cell array 210, a Y decoder 230 for selecting the page buffer unit 220 according to an input address, a X decoder 240 for selecting the word lines of the memory cell array 210 according to an input address, a voltage supply unit 250 for generating an operating voltage for the operation of the flash memory device 200, and a controller 260 for outputting a control signal for the operation of the NAND flash memory device 200.

The memory cell array 210 includes a plurality of memory cells (not shown), which is capable of storing data. The memory cells are arranged by bit lines BL and word lines WL.

The page buffer unit 220 includes a plurality of page buffer circuits. Each of the page buffer circuits is connected to a bit line pair of the memory cell array 210, and is configured to perform an operation for programming/reading data into/from a memory cell of bit lines connected thereto.

The Y decoder 230 supplies a data I/O path to the plurality of page buffer circuits of the page buffer unit 220 in response to the control signal. The X decoder 240 selects the word lines according to an input address.

The voltage supply unit 250 generates a voltage necessary for the operation of the NAND flash memory device 200 and supplies the voltage thereto. The voltage supply unit 250 performs a pumping operation before power-up begins as a power source is applied to the flash memory device 200, or when the flash memory device 200 is in an idle state, and generates and stores a predetermined level of voltage.

The controller 260 outputs the control signal to control the operation of the flash memory device 200.

The voltage supply unit 250 is described in detail below.

Figure 2B:
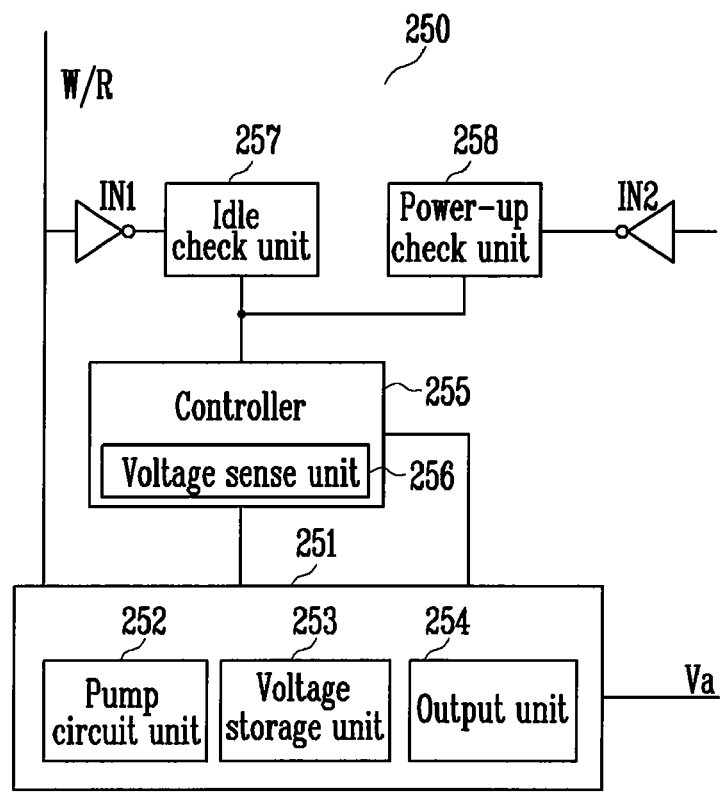
FIG. 2B is a detailed block diagram of a voltage supply circuit shown in FIG. 2A.

FIG. 2B is a detailed block diagram of the voltage supply circuit shown in FIG. 2A.

Referring to FIG. 2B, the voltage supply unit 250 includes a voltage generator 251 for pumping an operating voltage in response to the control signal and outputting a pumped voltage, a controller 255 for controlling the operation of the voltage generator 251 according to an operating mode of the flash memory device 200, an idle check unit 257 for checking whether an operating signal input to the flash memory device 200 is at an idle state, a power-up check unit 258 for checking whether an external voltage is input to the flash memory device 200 and power-up begins, and first and second inverters IN1, IN2.

The voltage generator 251 includes a pump circuit unit 252 for pumping an input voltage and generating the input voltage as a high voltage, a voltage storage unit 253 for storing a voltage pumped by the pump circuit unit 252 before an idle state or power-up, and an output unit 254 for outputting a voltage, which is pumped by the pump circuit unit 252, as the operating voltage Va. The controller 255 includes a voltage sense unit 256 for sensing the level of a voltage generated by the voltage generator 251.

The voltage generator 251 is input with an operation command signal (Write/Read; W/R), which is input to the flash memory device 200, and pumps an operating voltage in response to the operation command signal. The voltage generator 251 also starts a pumping operation under the control of the controller 255 irrespective of the operation command signal.

The pump circuit unit 252 of the voltage generator 251 pumps an input voltage in response to the operation command signal W/R or the control signal of the controller 255, and generates a high voltage. The voltage storage unit 253 stores an initial voltage, which is generated by the pump circuit unit 252, under the control of the controller 255. The voltage storage unit 253 can be implemented using a capacitor.

The output unit 254 outputs the operating voltage Va, which is output by the pump circuit unit 252, under the control of the controller 255.

The controller 255 outputs the control signal, which enables the pump circuit unit 252 to start the voltage pumping, in response to the idle signal or the power-up signal output from the idle check unit 257 or the power-up check unit 258. The voltage sense unit 256 of the controller 255 senses the level of a voltage, which is pumped and output by the pump circuit unit 252.

The controller 255 confirms the level of a voltage, which is generated by the pump circuit unit 252 before an idle state or a power-up start, from the voltage sense unit 256. If the pump circuit unit 252 performs pumping up to a set initial voltage level, the controller 255 stops the operation of the pump circuit unit 252. The controller 255 then controls the initial voltage, which has been pumped by the pump circuit unit 252, to be stored in the voltage storage unit 253.

Further, the controller 255 controls the pump circuit unit 252 to start a pumping operation using the initial voltage stored in the voltage storage unit 253 in response to the operation command signal W/R, and also controls the output unit 254 to output the operating voltage Va output from the pump circuit unit 252.

The first inverter IN1 inverts the operation command signal W/R, and inputs an inverted signal to the idle check unit 257. The idle check unit 257 supplies the controller 255 with the idle signal at a high level when the operation command signal W/R is not input thereto.

The second inverter IN2 inverts a power-up start signal, and inputs an inverted signal to the power-up check unit 258. The power-up check unit 258 inputs the control signal at a high level to the controller 255 before power-up begins, and inputs the control signal at a low level to the controller 255 when power-up begins.

The controller 255 controls the pump circuit unit 252 to perform an initial voltage pump operation when the idle check unit 257 or the power-up check unit 258 inputs the control signal at a high level.

A method of operating the voltage supply unit 250 constructed as above is described in detail below.

Figure 3:
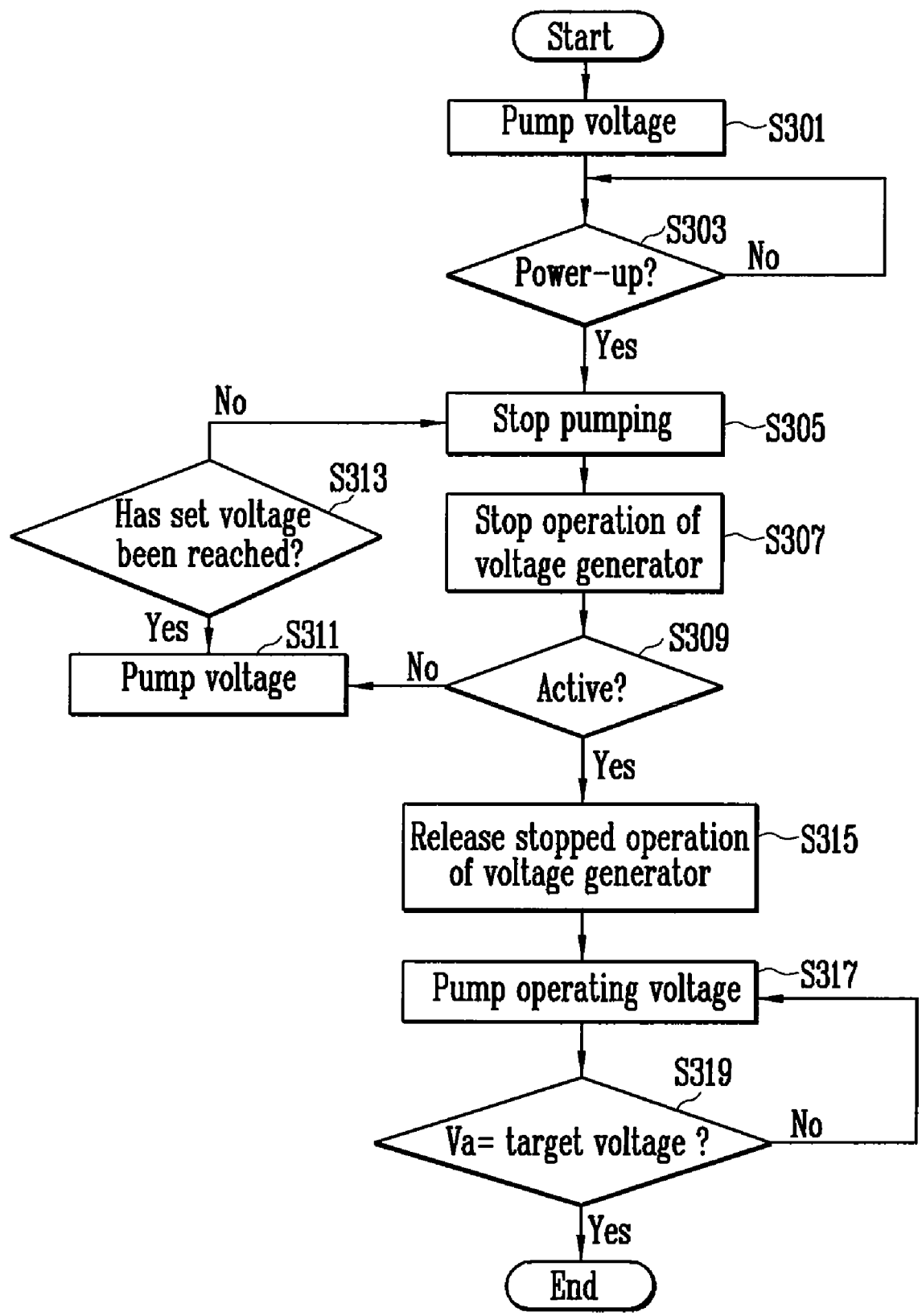
FIG. 3 is an operation flowchart of a method performed by the flash memory device shown in FIG. 2A.

FIG. 3 is an operation flowchart of a method performed by the flash memory device shown in FIG. 2A.

Referring to FIG. 3, before an external voltage is input to the flash memory device 200 and power-up begins, the pump circuit unit 252 performs voltage pumping in step S301.

If the flash memory device 200 is applied with the external voltage, the power-up check unit 258 inputs the control signal at a high level to the controller 255 up to a PUP.

The controller 255 controls the pump circuit unit 252 to perform a pumping operation in response to the control signal at a high level, which is input by the power-up check unit 258. The controller 255 may control a pumped voltage level not to exceed a set voltage level. The pumped voltage is stored in the voltage storage unit 253.

If the PUP is reached and power-up begins in step S303, the power-up check unit 258 inputs the control signal at a low level to the controller 255. The controller 255 stops the operation of the pump circuit unit 252 in response to the control signal at a low level from the power-up check unit 258 in step S305. The controller 255 controls the voltage, which has been generated by the pump circuit unit 252 in step S301, to be stored in the voltage storage unit 253, and simultaneously stops the operation of the voltage generator 251 so that the output unit 254 does not output the voltage in step S307. In some embodiments, steps S306 and S307 may be performed at the same time, or the sequence of the steps may be changed.

The power-up check unit 258 outputs only the control signal at a low level beginning from a point where power-up begins. Meanwhile, the idle check unit 257 outputs an idle signal depending on whether the operation command signal is input to the flash memory device 200.

In other words, if the operation command signal W/R is input at a high level, the idle check unit 257 outputs the idle signal at a low level. If the operation command signal W/R is input at a low level, however, the idle check unit 257 inputs the idle signal at a high level to the controller 255. The controller 255 determines whether the flash memory device 200 is currently in an active state or an idle state in step S309.

If the idle check unit 257 inputs the idle signal at a high level, the controller 255 determines that the flash memory device 200 is in the idle state and not the active state, and controls the pump circuit unit 252 to start a voltage pumping operation in step S311. At this time, the pump circuit unit 252 can begin pumping the voltage beginning from the level of the voltage which has been pumped in step S301 and stored in the voltage storage unit 253.

Furthermore, the voltage sense unit 256 of the controller 255 senses the level of a voltage, which has been pumped and output by the pump circuit unit 252, determines whether the level of the sensed voltage reaches a preset initial voltage in step S313, and informs the controller 255 of the results.

If, as a result of the determination, the pump circuit unit 252 has pumped the voltage up to the preset initial voltage, the controller 255 stops the pumping operation in step S305, stores the pumped voltage in the voltage storage unit 253, and also stops the operation of the voltage generator 251 so that the output unit 254 does not output the voltage in step S307.

The steps S305 to S313 are periodically repeated while the idle state continues since the operation command is not input to the flash memory device 200.

Furthermore, if the operation command, such as a program command or a read command, is input to the flash memory device 200 and the operation command signal W/R at a high level is thus input to the voltage generator 251, the idle check unit 257 inputs the idle signal at a low level to the controller 255, informing the controller 255 that the flash memory device 200 is in an active mode.

The controller 255 releases the operation of the voltage generator 251, which has been stopped in the active mode in step S307, so that the voltage generator 251 operates normally in step S315. In the voltage generator 251 that operates normally, the pump circuit unit 252 performs voltage pumping using an input voltage in step S317. The pumped voltage is stored in the voltage storage unit 253 and is then added to the voltage. If the sum of the voltage pumped by the pump circuit unit 252 and the voltage stored in the voltage storage unit 253 reaches the operating voltage Va in step S319, the output unit 254 outputs the result.

In accordance with the voltage supply unit constructed as described above according to an embodiment of the present invention, if a voltage stored in the voltage storage unit 253 is set to 10 V, a desired target voltage can be reached rapidly because the voltage level of 10 V has been reached before the voltage supply unit reaches an active state and a pumping voltage of the pump circuit unit 152 is then combined.

Figure 4:
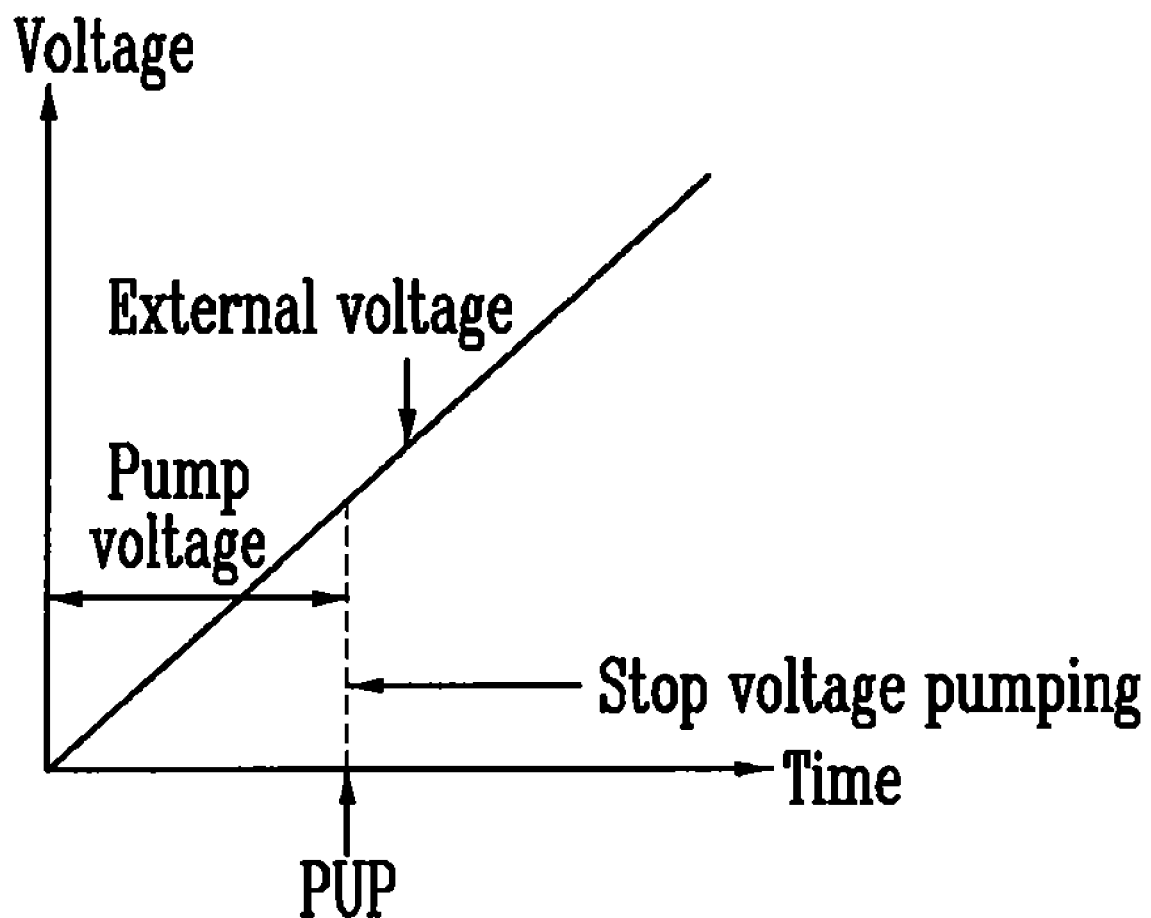
FIG. 4 is a view illustrating a relationship between the operation of the voltage supply circuit and an external voltage according to an embodiment of the present invention.

FIG. 4 is a view illustrating a relationship between the operation of the voltage supply circuit and an external voltage according to an embodiment of the present invention.

From FIG. 4, it can be seen that if an external voltage is input, the controller 255 controls the pump circuit unit 252 to perform a voltage pumping operation before power-up begins and stops the voltage pumping operation when the PUP is reached.

A pumping time from a set initial voltage to a target voltage can be shortened compared with a time taken to pump the external voltage (VDD) level of a low voltage to a target voltage for an operation, and a stable operating voltage can be provided.

As described above, according to the voltage supply circuit and the flash memory device including the same, and the method of supplying an operating voltage in accordance with the present invention, an operating voltage is pumped to a set level and stored before power-up begins or an idle state is achieved. Accordingly, the time require to pump a voltage to an operating voltage level can be reduced and a stable operating voltage can be provided.

Although the foregoing description has been made with reference to specific embodiments, it is to be understood that changes and modifications of the present invention may be made by one having ordinary skill in the art without departing from the spirit and scope of the present invention and appended claims.

What is claimed is:

1. A voltage supply circuit comprising:
 a voltage generator configured to
  before power-up begins, pump an externally input voltage and store the pumped external voltage as a first voltage, wherein the first voltage has a set voltage level, or
  pump the externally input voltage, add the pumped voltage to a stored voltage, and output the added voltage as an operating voltage; and
 a controller configured to output a first control signal to drive the voltage generator or stop an operation of the voltage generator, wherein the controller outputs the first control signal or stops the operation of the voltage generator according to an operating state, wherein the voltage generator comprises
a voltage rising output unit for pumping and outputting the external voltage, and
a voltage storage unit for storing the voltage generated by the voltage rising output unit.

2. The voltage supply circuit of claim 1, further comprising:
a power-up check unit configured to check a power-up start according to an application of the external voltage and input a power-up check signal to the controller; and
a status check unit configured to perform a status check with respect to an idle state or an active state according to an operation command signal, and input a status check signal to the controller.

3. The voltage supply circuit of claim 2, wherein the voltage rising output unit comprises a pump circuit for pumping an input voltage and outputting the pumped voltage.

4. The voltage supply circuit of claim 2, wherein the voltage storage unit comprises a capacitor.

5. The voltage supply circuit of claim 2, wherein the controller comprises voltage sense means for sensing a level of the voltage stored in the voltage storage unit.

6. The voltage supply circuit of claim 2, wherein the controller is configured to control the voltage rising output unit to generate the first voltage before the power-up start, the controller being further configured to store the generated first voltage in the voltage storage unit.

7. The voltage supply circuit of claim 2, wherein the controller is configured to control the voltage rising output unit to operate in an idle state, generate a second voltage at a voltage level, and store the generated second voltage in the voltage storage unit, the voltage level of the second voltage being the same as or higher than the first voltage.

8. The voltage supply circuit of claim 7, wherein the voltage level of the second voltage is produced by adding the voltage pumped by the voltage rising output unit in the idle state to the first voltage stored in the voltage storage unit.

9. The voltage supply circuit of claim 7, wherein the controller controls the voltage pumped by the voltage rising output unit in the active state to be added to the voltage stored in the voltage storage unit, and further wherein the controller controls the voltage stored in the voltage storage unit to be output when a level of the voltage stored in the voltage storage unit reaches an operating voltage level.

10. A flash memory device comprising:
a memory cell array including a plurality of memory cells respectively connected to a plurality of bit line pairs and a plurality of word lines;
a plurality of page buffer circuits corresponding to the plurality of bit line pairs, respectively, and configured to program data into the memory cells or read data stored in the memory cells;
a voltage supply unit having a voltage generator and a controller for controlling the voltage generator, wherein the voltage generator comprises
a voltage rising output unit for pumping and outputting the external voltage, and
a voltage storage unit for storing the voltage generated by the voltage rising output unit; and
Y decoder circuits connected to the plurality of page buffer circuits, respectively, and a data I/O line, the Y decoder circuits being configured to transmit program data to the page buffer circuits and output read data received from the page buffer circuits to the data I/O line.

11. The flash memory device of claim 10, wherein the voltage generator is configured to:
before power-up begins, pump an externally input voltage and store the pumped external voltage as a first voltage having a set voltage level, or
pump the externally input voltage, add the pumped voltage to a stored voltage, and output the added voltage as an operating voltage.

12. The flash memory device of claim 10, further comprising:
a power-up check unit for checking a power-up start according to an application of the external voltage and inputting a power-up check signal to the controller; and
a status check unit for performing a status check with respect to an idle state or an active state according to an operation command signal, and inputting a status check signal to the controller.

13. The flash memory device of claim 12, wherein the controller is configured to:
output a first control signal to drive the voltage generator, or
stop an operation of the voltage generator,
wherein the controller outputs the first control signal or stops an operation of the voltage generator according to a operating state.

14. The flash memory device of claim 10, wherein the voltage rising output unit comprises a pump circuit for pumping an input voltage and outputting the pumped voltage.

15. The flash memory device of claim 10, wherein the voltage storage unit comprises a capacitor.

16. The flash memory device of claim 10, wherein the controller comprises voltage sense means for sensing a level of the voltage stored in the voltage storage unit.

17. The flash memory device of claim 10, wherein the controller controls the voltage rising output unit to generate the first voltage before the power-up start, the controller storing the generated first voltage in the voltage storage unit.

18. The flash memory device of claim 10, wherein the controller controls the voltage rising output unit to operate in an idle state, generate a second voltage at a voltage level, and store the generated second voltage in the voltage storage unit, wherein the voltage level of the second voltage is the same as or higher than the first voltage.

19. The flash memory device of claim 18, wherein the second voltage is produced by adding the voltage pumped by the voltage rising output unit in the idle state to the first voltage stored in the voltage storage unit.

20. The flash memory device of claim 18, wherein the controller controls the voltage pumped by the voltage rising output unit in the active state to be added to the voltage stored in the voltage storage unit, and controls the voltage stored in the voltage storage unit to be output when a level of the voltage stored in the voltage storage unit reaches an operating voltage level.

21. A method of supplying an operating voltage of a flash memory device, the method comprising:
raising a voltage level using an external voltage before power-up and generating a first voltage;
in the event that a current operating state of a flash memory device is an idle state, pumping the external voltage, adding the pumped voltage to the first voltage, and generating the added voltage as a second voltage; and
in the event that a current operating state of the flash memory device shifts from an idle state to an active state, pumping the external voltage, adding the pumped voltage to the second voltage, and generating an operating voltage for program or read.

22. The method of claim 21, wherein the first voltage or the second voltage is stored.

23. The method of claim 21, further comprising in the event that a current operating state of the flash memory device shifts from the idle state to the active state after power-up begins, pumping the external voltage, adding the pumped voltage to the first voltage, and generating the added voltage as an operating voltage for program or read.

24. The method of claim 21, wherein a voltage generated in a state other than the active state is not output.

* * * * *